United States Patent [19]

Shinji

[11] Patent Number: 5,357,128
[45] Date of Patent: Oct. 18, 1994

[54] CHARGE DETECTING DEVICE

[75] Inventor: Uya Shinji, Kyungki, Rep. of Korea

[73] Assignee: Goldstar Electron Co., Ltd., Rep. of Korea

[21] Appl. No.: 113,616

[22] Filed: Aug. 27, 1993

[51] Int. Cl.$^5$ .................. H01L 29/796; G11C 19/28
[52] U.S. Cl. ............................ 257/239; 257/224; 377/60
[58] Field of Search .............. 257/239, 216–224; 377/60

[56] References Cited

U.S. PATENT DOCUMENTS

| | | | |
|---|---|---|---|
| 4,074,302 | 2/1978 | Brewer | 257/239 |
| 4,672,645 | 6/1987 | Bluzer | 377/60 |
| 4,984,045 | 1/1991 | Matsunaga | 257/239 |
| 5,223,725 | 6/1993 | Miwada | 257/239 |
| 5,229,630 | 7/1993 | Hamasaki | 257/239 |

Primary Examiner—Gene M. Munson
Attorney, Agent, or Firm—Poms, Smith, Lande & Rose

[57] ABSTRACT

A charge detecting device in which a buried type charge sensing channel and a surface type floating surface channel crossing with the charge sensing channel in three-dimensional, the floating surface channel having a surface potential varying depending on a charge amount of the charge sensing channel, the device being characterized by a surface channel region disposed on the charge sensing channel, surface channel the region having a conductivity opposite to that of the charge sensing channel. A surface-invertible buried channel isolation region is disposed between the charge sensing channel and each of a source and a drain both formed on either side of the floating surface channel. Carriers of the floating surface channel and the charge sensing channel correspond to electrons of the same polarity. With this structure, there is no problem of dark current. Also, a short noise caused by dark noise is reduced, thereby enabling a high sensitivity to be obtained.

3 Claims, 4 Drawing Sheets

CHARGE DETECTING DEVICE

BACKGROUND OF THE INVENTION

1. Field of the Invention

The present invention relates to manufacture of charge detecting devices with a high sensitivity, and more particularly to manufacture of devices such as CCD image sensors which are required to sense micro signal charge, with a high sensitivity.

2. Description of the Prior Art

Conventionally, there have been known various charge detecting devices. The following description will be made, in conjunction with conventional charge detectors employed in solid state image sensors of charge coupled devices (CCDs).

FIG. 5 is a schematic sectional view of a floating surface detector disclosed in "1989's International Conference on Solid State Device and Materials (Extended Abstracts pp. 355 to 358)" by Ohsawa, Toshiba Company, Japan. The floating surface detector comprises a n type substrate 1 and a p⁻ well layer 2 formed over the surface of substrate 1. Formed on the p⁻ well layer 2 are a sensing channel 5 which is a high concentration n type region, and a source 20 and a drain 21 both of which are p+ regions. The floating surface detector also comprises a gate oxide film 4 formed over the entire exposed surface of the resultant structure, a floating gate 12 formed on a portion of gate oxide film 4 disposed over the sensing channel 5, a thickened insulating layer 15 formed over the floating gate 12, and a bias gate 14 formed over the insulating layer 15.

The sensing channel 5 is connected to a CCD which transfers signal charges in a direction normal to the plane of FIG. 5. The signal charges are transferred to a buried channel (not shown). As the transferred signal charges are accumulated in the sensing channel 5, the potential distribution in the sensing channel 5 is varied, so that the potential at the boundary surface between the gate oxide film 4 and the sensing channel 5 and the potential of the floating gate 12 are varied. By these variations, a transistor is activated, which utilizes holes as carriers and the boundary surface between the gate oxide film 4 and the sensing channel 5 as the p type surface channel.

This transistor can operates with a high sensitivity, in that it can have a very reduced sensing capacitance and little parasitic capacity.

The sensing channel also achieves the signal transfer under a completely depleted condition, thereby enabling a complete transfer of signal charges. Accordingly, it is possible to greatly restrain 1/f noise.

Toshiba company reported that the high sensitivity of 76μV/e⁻ could be compatible with the low noise of no more than 64μV.rms (noise equivalent signal—1.2 electrons rms). However, there is a problem that the source and the drain of the transistor have the same conductivity as the p well, whereas the carriers have a polarity opposite to that of signal charges.

Since the p well is generally grounded, holes present in all regions of the well are diffused into the source or the drain. As a result, a short noise of dark current occurs undesirably due to the diffused holes.

Where an incident light is present, the number of holes generated is the same as the number of electrons. Although an overflow drain is provided for electrons, there is no drain structure which can operate surely for holes.

At the peripheral portion, contacts for the p well are present. However, since the contacts are apart from the pixel portion at a long distance, there is a possibility that a phenomenon of an increase in signal current occurs due to leakage currents of holes which increase temporarily when light is incident.

For solving this problem, a method of using a p+ type substrate to fix the vertical over flow drain structure for electrons or of keeping the well of charge detector independently from the pixel portion may be assumed. However, it is hardly possible to realize such a method.

SUMMARY OF THE INVENTION

Therefore, an object of the invention is to solve the above-mentioned problems encountered in the prior arts and thus to provide a charge detecting device capable of detecting the charge amount of electrons by use of a transistor which utilizes electrons as carriers, thereby reducing a short noise caused by dark current and improving the sensitivity.

In accordance with the present invention, this object can be accomplished by providing a charge detecting device wherein an n type channel transistor utilizing electrons as carriers is provided at a surface of a region, where a p type channel transistor is used, so that a p type layer (surface channel) is formed at a surface of a n type sensing channel and that a surface portion of a n+ region between the sensing channel and each of a source and a drain forms a surface-invertible channel isolation region constituted by a p well layer.

By forming a p type surface channel region of the conductivity type opposite to that of the sensing channel at the surface of the sensing channel, a surface channel for electrons is formed beneath a floating gate. The surface channel is modulated, correspondingly to the amount of charges transferred to the sensing channel.

Since the surface-invertible channel isolation region is provided between the sensing channel and each of the source and the drain, a structure is obtained, in which current flows from the source and drain to the surface channel region, while no current flows toward the buried channel region.

As the transistor in which carriers having the same conductivity as charges being detected can be used, the problem of dark current occurring at the well layer can be solved. The short noise caused by the dark current can also be reduced. Accordingly, it is possible to realize a charge detecting device with a higher sensitivity.

There is no phenomenon of an increase in signal output when strong light is incident. It is also possible to eliminate a process for forming p+ regions for providing source and drain regions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1 to 4, there is illustrated an embodiment of the present invention which is applied to a charge detector of an CCD image sensor.

Figure 1:
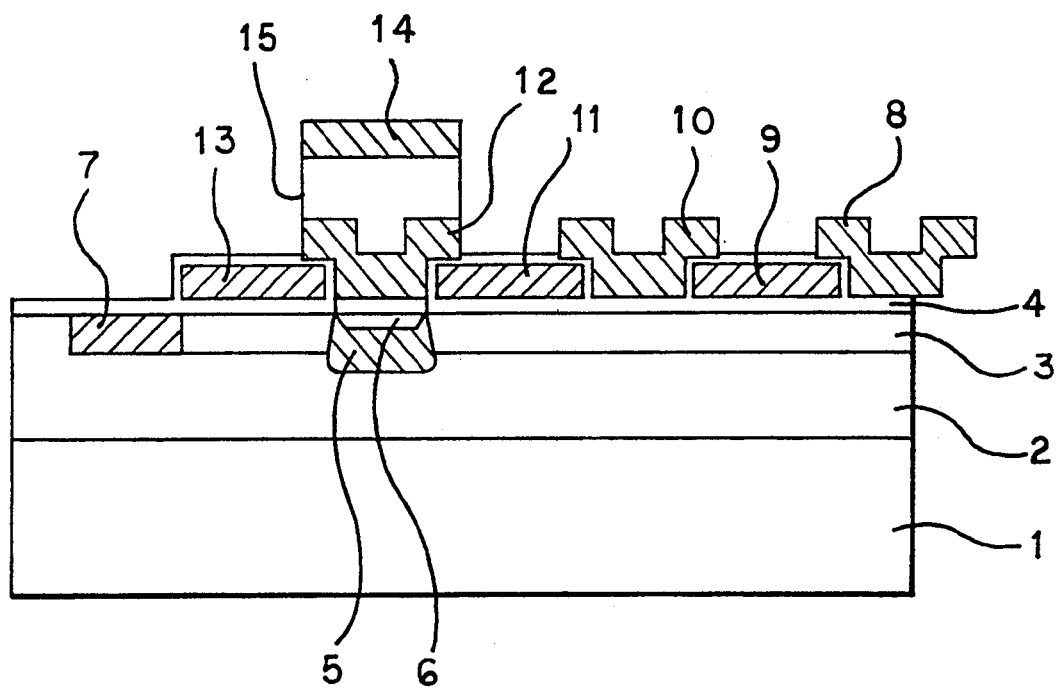
FIG. 1 is a schematic sectional view of a charge detecting device in accordance with the present invention, taken in a direction that charges are transferred.

FIG. 1 is a schematic sectional view of the charge detector, taken in a direction that signal charges are transferred by the CCD.

The charge detector comprises a n type silicon substrate 1 and a p well layer 2 formed over the silicon substrate 1. Formed over the p well layer 2 are a n type buried channel 3, a n type sensing channel 5, a p type surface channel 6, and a reset drain 7 which are disposed at desired regions on the p well layer 2. A gate oxide film 4 is formed over the entire exposed surface of the resultant structure. Formed over the gate oxide film 4 are a reset gate 13, CCD transfer electrodes 8, 9 and 10, an output gate 11, a floating gate 12. A thick insulating layer 15 and a bias gate 14 are formed over the floating gate 12.

Figure 3:
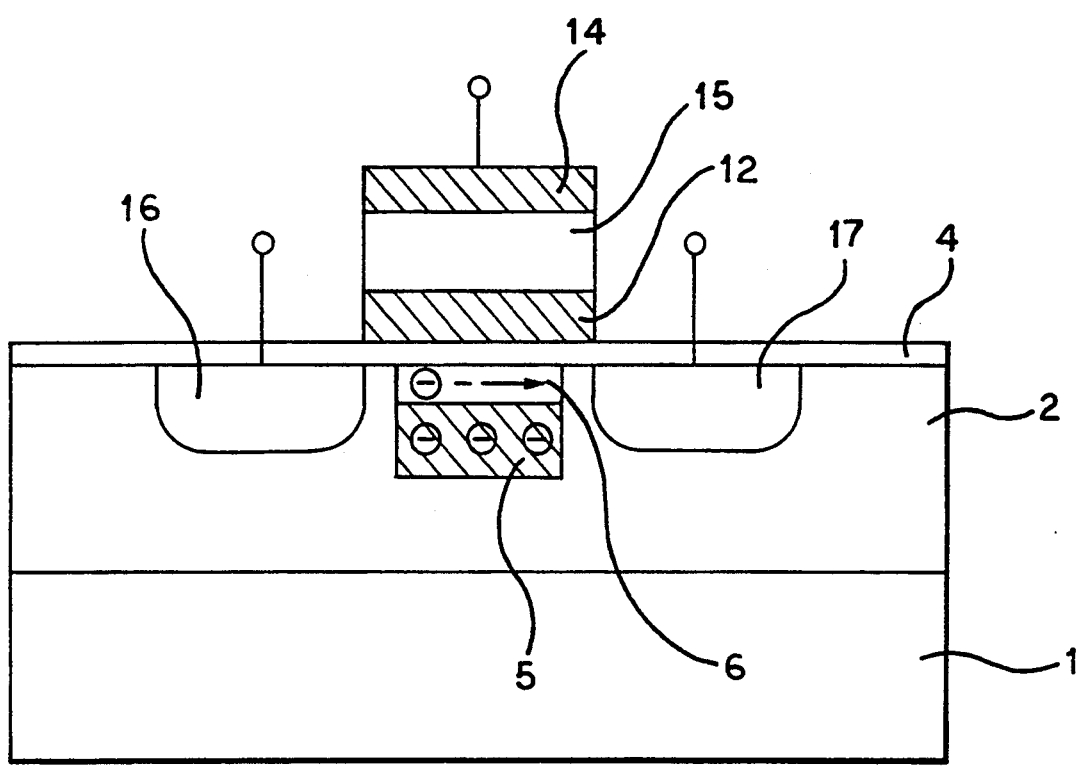
FIG. 3 is a schematic sectional view of the charge detecting device in accordance with the present invention, taken in a direction normal to the direction that charges are transferred.

Areas directly related with the present invention are regions designated by the reference numerals 5, 6, 12, 14 and 15. A vertically-taken sectional view of these regions are shown in FIG. 3. These regions correspond to a n type surface channel transistor which operates by detecting charges transferred by the CCD.

In the CCD image sensor, signal charges generated in a photodiode of each pixel by an incident light are transferred to the buried channel 3 by the CCD, so that they enter the sensing channel 5.

Figure 2:
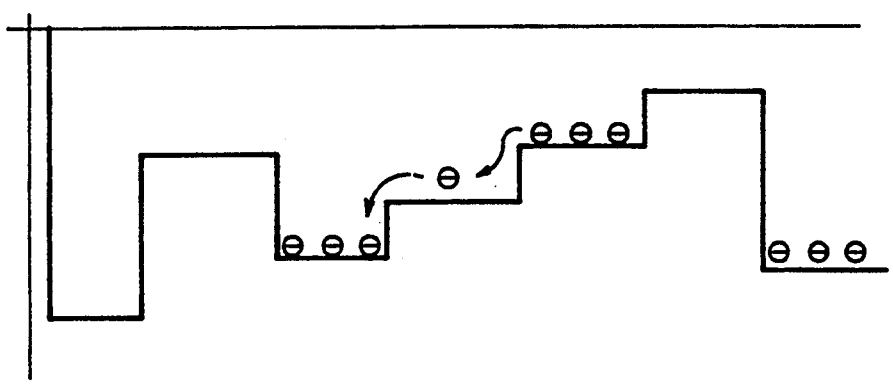
FIG. 2 is a diagram illustrating a potential distribution in a silicon substrate corresponding to the structure of FIG.

At this time, the reset drain 7 or the reset gate 13, the bias gate 14, the output gate 11 and the CCD transfer electrodes 8, 9 and 10 become biased with proper voltages, respectively. The potential profiles of channels transferring signal charges are obtained as shown in FIG. 2.

As signal charges flow into the sensing channel 5, the potential in the sensing channel 5 is varied. The surface potential of the surface channel 6 is also varied.

Figure 4A:
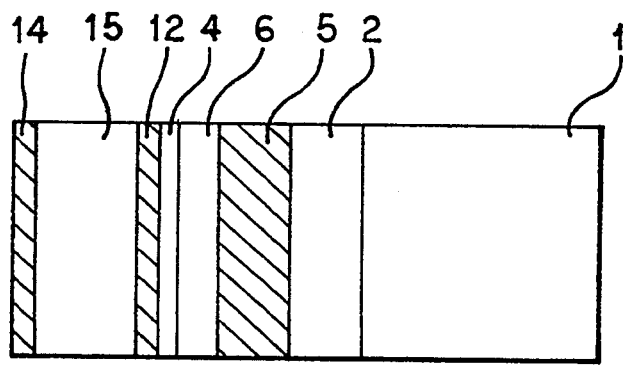
FIGS. 4a to 4d show partial sectional structures of the charge detecting device and potential distributions thereof, respectively.
Figure 4B:
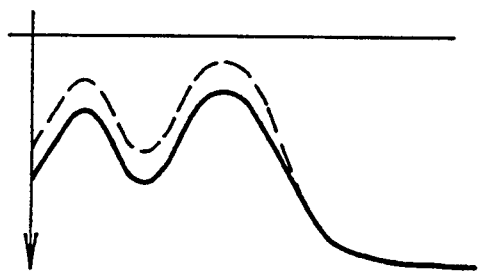

FIGS. 4a and 4b show a sectional structure of the substrate including the sensing channel, taken along the depth of substrate, and a potential distribution thereof.

In FIGS. 4a and 4b, the potential distribution in a case that no charge is present in the sensing channel 5 is indicated by the solid line, whereas the potential distribution in a case that signal charges fill the sensing channel 5 to saturate it is indicated by the phantom line.

Figure 4C:
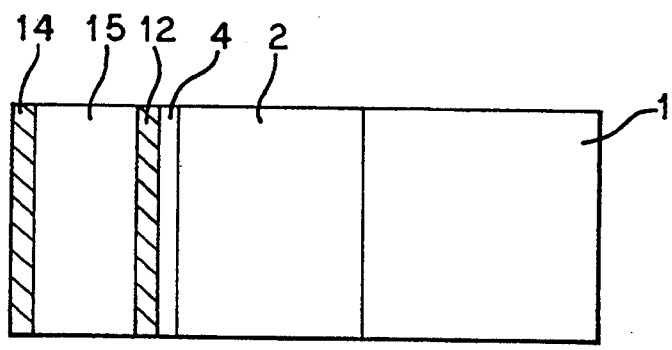
Figure 4D:
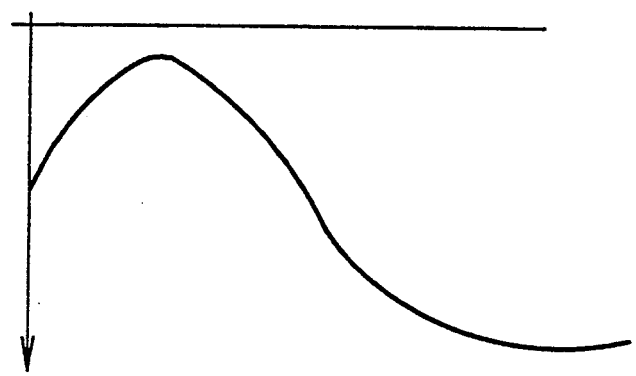
Figure 5:
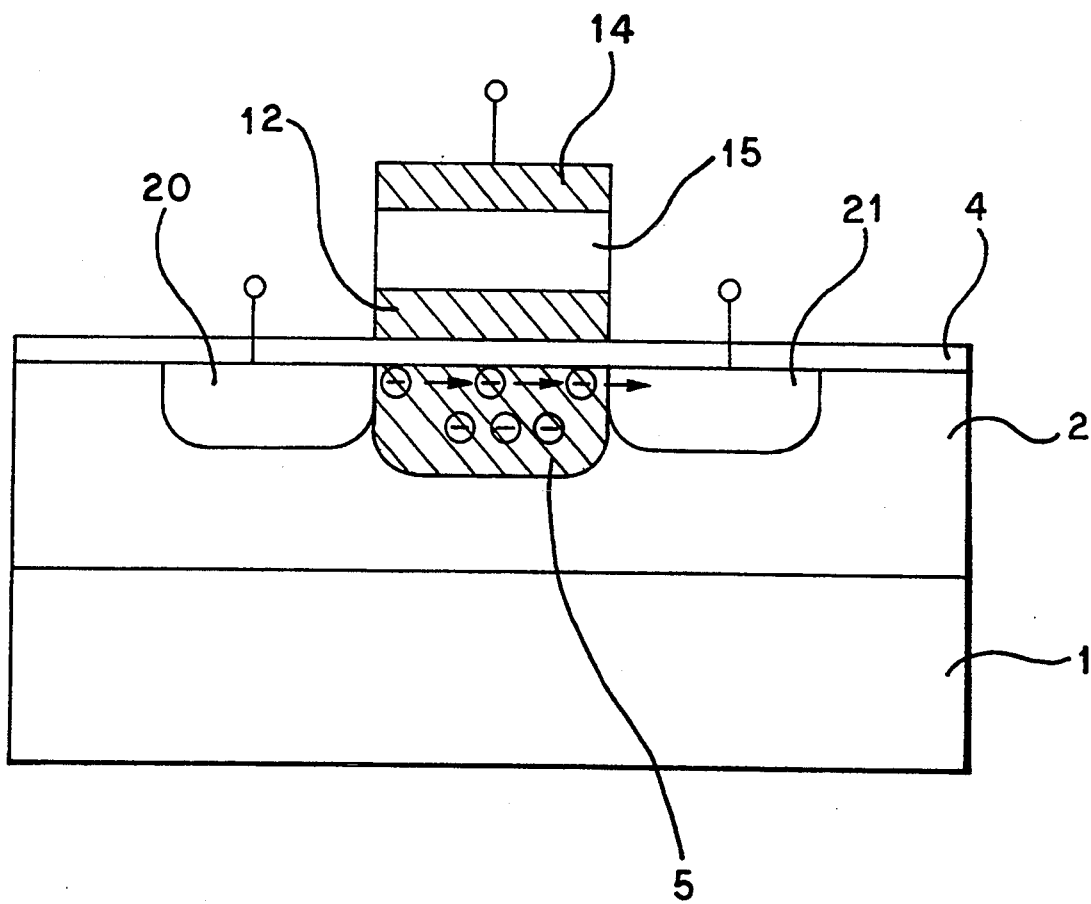
FIG. 5 is a schematic sectional view of a conventional charge detecting device.

On the other hand, FIGS. 4c and 4d show a sectional structure of a channel isolation region between the buried channel and the sensing channel and a potential distribution thereof.

The detection of signal charges is achieved, by detecting the variation in potential distribution in the surface channel 6 corresponding to the signal charges.

This structure is characterized in that the sensing channel 5 is provided at its surface with the p type surface channel 6 which has the conductivity opposite to that of the sensing channel 5 and thus serves as a surface channel for electrons. Also, the portion of p well region 2 disposed between sensing channel 5 and each of the source 16 and the drain 17 serves as a channel isolation portion for the buried channel 3. It is possible to prevent these channel isolation regions from interfering with current flowing from the source to the drain, when the channel isolation regions are designed to have a surface potential deeper than that of the surface channel 6 of the sensing channel 5, because the substrate surface is inverted to operate as a surface channel.

As apparent from the above description, the present invention realizes a charge detector capable of detecting the charge amount of electrons by use of a transistor which utilizes electrons as carriers.

Although the present invention has been described, in conjunction with the embodiment wherein signal charges correspond to electrons, it can be equivalently applied to a case where signal charges correspond to holes. In accordance with the present invention, devices capable of transferring signal charges at a low transfer loss, other than CCDs may be used as devices for transferring signal charges to the sensing channel, to obtain the effect of the present invention.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A charge detecting device having a structure in which a buried type charge sensing channel and a surface type floating surface channel crossing with the buried type charge sensing channel in three-dimensions, the surface type floating surface channel having a surface potential varying depending on a charge amount of the buried type charge sensing channel, the device being characterized by:

a surface channel region disposed on the buried type charge sensing channel, the surface channel region having a conductivity opposite to that of the buried type charge sensing channel;

a surface-invertible buried channel isolation region disposed between the buried type charge sensing channel and each of a source and a drain; and carriers of the surface type floating surface channel and the buried type charge sensing channel corresponding to electrons of the same polarity.

2. A charge detecting device as set forth in claim 1 wherein said buried type charge sensing channel is a n type buried type charge sensing channel and the surface channel region is a p type surface channel region.

3. A charge detecting device as set forth in claim 1 wherein said source and said drain are formed on either side of said surface type floating surface channel.

* * * * *